United States Patent [19]

Opower

[11] Patent Number: 5,361,275
[45] Date of Patent: Nov. 1, 1994

[54] APPARATUS FOR REMOVING MATERIAL FROM A TARGET

[75] Inventor: Hans Opower, Krailling, Germany

[73] Assignee: Deutsche Forschungsanstalt fuer Luftund Raumfahrt e.V., Bonn, Germany

[21] Appl. No.: 112,710

[22] Filed: Aug. 26, 1993

[30] Foreign Application Priority Data

Sep. 3, 1992 [DE] Germany .............................. 4229397

[51] Int. Cl.$^5$ ................................................. H01S 3/08
[52] U.S. Cl. ...................................... 372/108; 372/22; 372/41
[58] Field of Search ....................... 372/10, 12, 18, 22, 372/41, 108; 359/328

[56] References Cited

U.S. PATENT DOCUMENTS 4,979,180  12/1990  Muncheryan ....................... 372/108
5,144,630   9/1992  Lin .

FOREIGN PATENT DOCUMENTS 3914070  3/1990  Germany .
4022817  11/1991 Germany .

OTHER PUBLICATIONS

R. J. D. Miller, et al., "Efficient Operation of a Cavity Dumped Q-Switched and Mode-Locked YAG Laser," *Optics Communications*, vol. 62, No. 3, May 1, 1987, pp. 185–189.

S. D. Savov, et al., "Electro-optically Controlled Mode-Locked Nd: YAG Laser System," *Optics and Laser Technology*, Aug., 1981, pp. 193–196.

J. M. Dawes, et al., "A High Repetition Rate Pico-Synchronous Nd; YAG Laser," *Optics Communications*, vol. 65, No. 4, Feb. 15, 1988, pp. 275–278.

M. S. Demokan, "Mode-Locking in Solid-State and Semiconductor Lasers," Research Studies Press, J. Wiley & Sons Ltd., Chichester, England, Jan. 1982, pp. 149–152.

*Primary Examiner*—Rodney B. Bovernick
*Assistant Examiner*—Robert E. Wise
*Attorney, Agent, or Firm*—Barry R. Lipsitz

[57] ABSTRACT

In order to improve an apparatus for removing material from a target, comprising a high-power laser generating laser pulses with a pulse duration in the picosecond range and comprising a resonator, in which a mode-locking device and a Q-switch are arranged, a frequency multiplier following the high-power laser and a beam guide for focusing the laser beam coming from the frequency multiplier onto the target, such that the energy in the single laser pulses having a pulse duration in the picosecond range is as high as possible, it is suggested that the resonator have fully reflecting end mirrors for generating single high-energy laser pulses, that a system for the controlled coupling out of single pulses be arranged in the resonator and that a control be provided for coupling out a single pulse following release of the laser activity by the Q-switch and the build up of the single pulse after repeated round trips through the resonator.

28 Claims, 4 Drawing Sheets

APPARATUS FOR REMOVING MATERIAL FROM A TARGET

The invention relates to an apparatus for removing material from a target, comprising a high-power laser generating laser pulses with a pulse duration in the picosecond range and comprising a resonator, in which a mode-locking device and a Q-switch are arranged, a frequency multiplier following the high-power laser and a beam guide for focusing the laser beam coming from the frequency multiplier onto the target.

An apparatus of this type is known, for example, from German patent 40 22 817.

In this apparatus, a conventional high-power laser is used which does not generate a single laser pulse having a pulse duration in the picosecond range but an entire pulse train comprising a plurality of laser pulses each having a pulse duration in the picosecond range. These pulses also follow one another at time intervals in the nanosecond range, whereby these time intervals between the individual laser pulses correspond to the round-trip time in the resonator.

An apparatus of this type has the disadvantage that, very often, high energies in the laser pulse are not or scarcely achievable with this apparatus since the maximum energy attainable in the resonator is distributed over the entire pulse train of laser pulses.

The object underlying the invention is therefore to improve an apparatus of the generic type such that the energy in the single laser pulses having a pulse duration in the picosecond range is as high as possible.

This object is accomplished in accordance with the invention, in an apparatus of the type described at the outset, in that the resonator has fully reflecting end mirrors for generating single high-energy laser pulses, that a system for the controlled coupling out of single pulses is arranged in the resonator and that a control is provided for coupling out a single pulse following release of the laser activity by the Q-switch and the build up of the single pulse after repeated round trips through the resonator.

The advantage of the inventive solution is therefore to be seen in the fact that in contrast to the systems previously known it is not a pulse train having laser pulses in the picosecond range which is generated but rather a single pulse which is built up in the resonator and then coupled out by single-pulse coupling-out means arranged in the resonator. In this way, the energy attainable in the resonator is concentrated in the single pulse so that in a simple manner the single pulse having the desired high energy is made available for carrying out the removal of material from the target.

With respect to the type of control for the single-pulse coupling-out means, different possibilities are conceivable. For example, in one expedient embodiment the control activates the single-pulse coupling-out means within a defined period of time after release of the laser activity by the Q-switch. This means that the number of round trips of the single pulse through the resonator can be determined, whereby the intensity of the single pulse is also predeterminable, at least within approximate limits, when amplification is provided by the laser medium.

It is even more advantageous, when the same intensity is always intended to be achieved, for the control to activate the single-pulse coupling-out means when an intensity threshold value is reached. This possibility therefore relates to a predeterminable intensity threshold value. However, with this type of control having uncertainty in the nanosecond range it cannot be determined at what point of time the coupling out of the single pulse occurs since a differing number of round trips of the single pulse through the resonator is required when the amplification varies. This uncertainty is not, however, detrimental for the inventive method.

The coupling out of single pulses can also be carried out in the most varied of manners. For example, in an advantageous embodiment the means for coupling out single pulses comprises a polarization-rotating Pockels cell and a polarization-dependent transmission/reflection mirror. When the Pockels cell is not activated, there is no rotation of the polarization and, therefore, this polarization-dependent transmission/reflection mirror allows the resonator radiation field to build up between the end mirrors of the resonator whereas when the Pockels cell is activated a rotation of the polarization occurs, namely in the direction in which the transmission/reflection mirror reflects and, therefore, couples out the single pulse transversely to the resonator axis. An even better power output can be achieved when a laser amplifier is arranged between the high-power laser and the frequency multiplier and this offers the possibility of amplifying the single pulse yet again.

When using a frequency multiplier in the previous systems, the part of the laser pulse which has not been frequency-multiplied is either masked out or focused onto the target together with the frequency-multiplied part of the laser pulse.

It is, however, particularly favourable for the frequency multiplier to be followed by a coupling-out element for the non-frequency-multiplied part of the laser pulse.

In the case where the non-frequency-multiplied part of the laser pulse is coupled out, it is expedient to provide a beam guide which focuses the frequency-multiplied part of the laser pulse onto the target. The non-frequency-multiplied part of the laser pulse can then be brought into a defined time relationship with the frequency-multiplied part of the laser pulse.

In this respect, it is particularly expedient for the non-frequency-multiplied part of the laser pulse to strike the target with a time delay in comparison with the frequency-multiplied part of the laser pulse.

This opens up the possibility, when a plasma is generated by the frequency-multiplied part of the laser pulse, of subsequently heating this plasma with the non-frequency-multiplied part of the laser pulse and, in particular, of homogenizing the particle energy in the plasma by subsequent heating of rearward areas of the plasma, i.e. those areas facing the target.

Such a delay of the non-frequency-multiplied part of the laser pulse may be realized particularly easily when the beam guide for the non-frequency-multiplied part of the laser pulse comprises a detour line for the pulse delay.

Focusing the frequency-multiplied and the non-frequency-multiplied parts of the laser pulse on the target may be achieved in the simplest case by having the frequency-multiplied part of the laser pulse and the non-frequency-multiplied part of the laser pulse focused onto the target with separate beam guides.

Alternatively thereto, in an additional advantageous embodiment a colinearizing element is provided, which brings together the frequency-multiplied and the non-frequency-multiplied parts of the laser pulse so that, in particular, a common focusing onto the target, for example by a common optical imaging means, is possible.

The colinearizing element is preferably designed as a prism which is capable of bringing together the different parts of the laser pulse from different directions on the basis of their differing wavelengths or frequencies to form a colinear laser pulse.

This colinearizing element permits, in particular, use of a common focusing system for the frequency-multiplied part of the laser pulse and the non-frequency-multiplied part of the laser pulse so that problems with adjustment in separate focusing systems do not arise and only the chromatic aberration in the focusing system must, where necessary, be taken into account.

In this respect, it is particularly advantageous for the frequency-multiplied and the non-frequency-multiplied parts of the laser pulse to form a defined sequence of pulses.

Especially when the laser pulse is intended to be used in a wavelength in the UV range, it has proven to be advantageous for the laser pulse to have a part which is repeatedly frequency-multiplied so that the plasma can preferably be generated by a part of the laser pulse which has been frequency-multiplied at least twice and comprises wavelengths in the UV range.

In this case, the part of the laser pulse which has been frequency-multiplied repeatedly and the part of the laser pulse which has been frequency-multiplied once impinge on the target.

In addition, in accordance with the aforementioned remarks concerning frequency-multiplied and non-frequency-multiplied parts of the laser pulse, the part of the laser pulse repeatedly frequency-multiplied and the part of the laser pulse frequency-multiplied once form a laser pulse train with time-staggered laser pulse parts, whereby this pulse train preferably comprises the non-frequency-multiplied part of the laser pulse, as well.

As laser, a laser is preferably used which has a laser pulse with a wavelength of less than 0.6 $\mu$m following corresponding frequency multiplication and pulse durations Tp in the order of 1 to 100 picoseconds.

Power densities in the focus of $10^9$ to $10^{12}$ watts per $cm^2$ are preferably provided.

The single laser pulses having pulse durations in the picosecond range or, instead of the single pulse trains, frequency-multiplied and non-frequency-multiplied laser pulse parts or laser pulse parts repeatedly frequency-multiplied and parts frequency-multiplied once are preferably generated with a repetition rate in the range of approximately 10 kHz.

The inventive apparatus serves, in particular, to remove material from a target during the production of layers for the functional structure of a semiconductor component, in particular the application of layers for the functional structure of a semiconductor component, according to which cluster-free layers are, in particular, applied in accordance with German patent 40 22 817. In this respect, reference is made to the entire contents of this patent.

Additional advantages and features of the invention are the subject matter of the following description as well as of the drawings of several embodiments. In the drawings.

Figure 1:
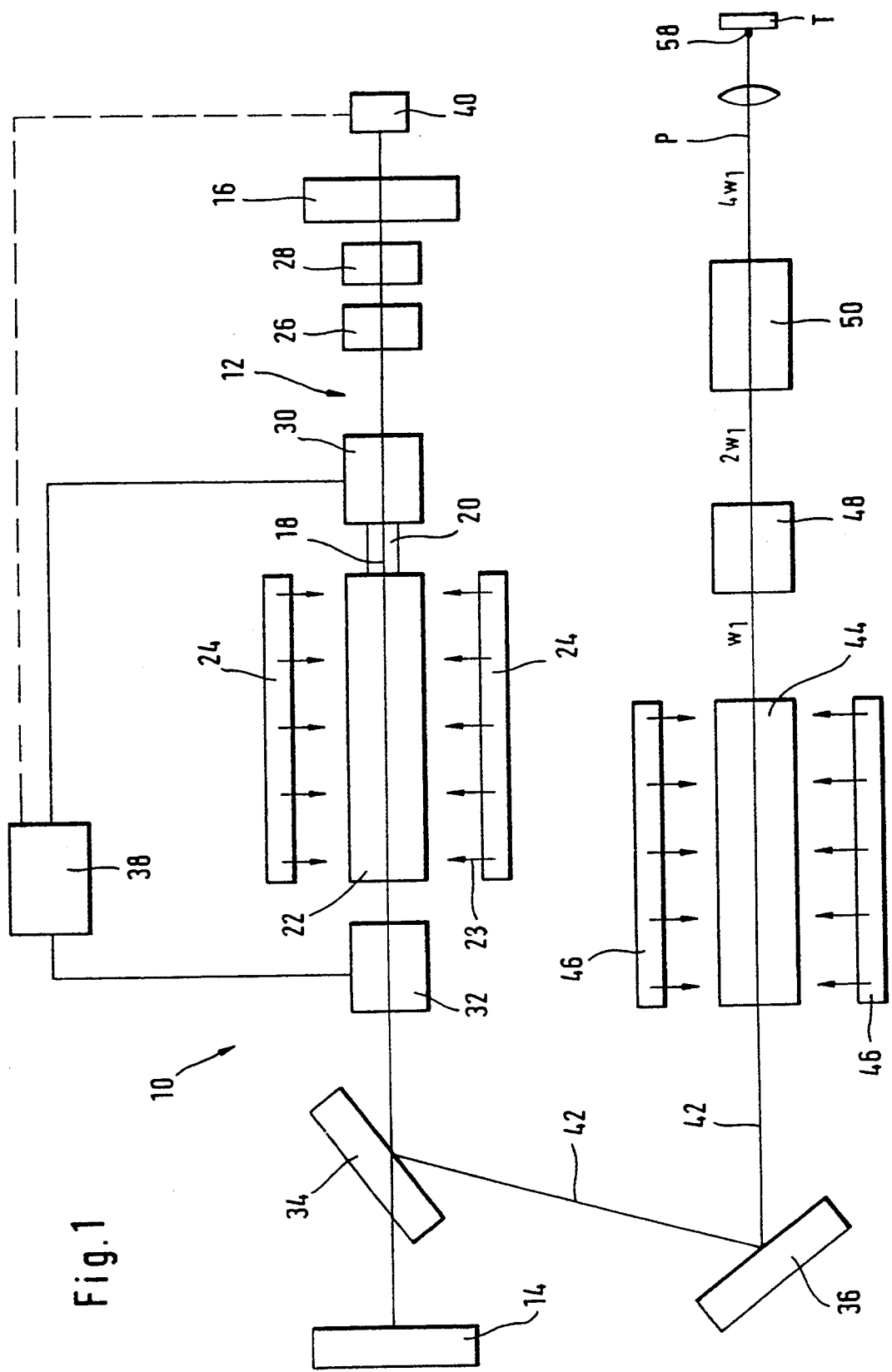
FIG. 1 is a schematic illustration of a first embodiment of an inventive laser system.

One embodiment of a laser system used in accordance with the invention, and designated as a whole in FIG. 1 as 10, comprises a laser resonator 12, which is closed at its ends by two fully reflecting end mirrors 14 and 16. A resonator axis 18 hereby determines the resonator radiation field 20 building up between the end mirrors 14 and 16.

In addition, an oscillator crystal 22 is arranged between the end mirrors and this represents the laser-active medium. This oscillator crystal 22 is pumped by rows of diodes 24 which act on the oscillator crystal with pumping light along the arrows 23, i.e. transversely to the resonator axis 18. The diodes of these rows 24 are semiconductor diodes, for example made from GaAlAs or InGaAlAs.

Furthermore, two modulators 26 and 28 are arranged in front of the end mirror 16 and these modulators serve the purpose of mode-locking in the resonator radiation field, whereby their transmission is modulated with the frequency of the round-trip time of the laser resonator 12. In addition, a Pockels cell 30 is located between the modulators 26 and 28 and the oscillator crystal 22 and this serves the purpose of Q-switching in the laser resonator in order to control the build-up of the resonator radiation field 20 with a pulse having a half width in the picosecond range.

The components of the inventive laser system 10 described so far represent the components of a laser system known from the prior art for generating laser pulses in the picosecond range by means of mode-locking.

An additional Pockels cell 32 is provided between the oscillator crystal 22 and the end mirror 14 and a polarization-dependent transmission and reflection mirror 34 between the Pockels cell 32 and the end mirror 14. This mirror 34 is arranged such that it allows one polarization direction to pass through to the end mirror 14 while the other polarization direction at right angles thereto is reflected.

When the Pockels cell 32 is not activated, the transmission and reflection mirror 34 allows the resonator radiation field 20 to pass through to the end mirror 14. When the Pockels cell 32 is activated, the polarization plane is rotated in such a manner that the transmission and reflection mirror 34 reflects the laser radiation out of the laser resonator 12 onto a deflecting mirror 36 and therefore couples out the laser pulse P. For this purpose, a control 38 is provided which, on the one hand, activates the Pockels cell 30 such that a laser pulse P can build up in the resonator 12 due to reflection back and forth between the end mirrors 14 and 16. After a specific time, the Pockels cell 32 is activated and this rotates the polarization plane of the laser pulse P such that this is reflected by the transmission and reflection mirror 34 out of the laser resonator 12 and onto the deflecting mirror 36.

Alternatively, it is also conceivable, for example, to provide a detector 40 behind the end mirror 16 which is capable of measuring the intensity of the laser pulse P building up in the laser resonator 12 when end mirror 16 is transmitting only slightly. By interrogating this detector 40, it is possible to activate the Pockels cell 32 via the control 38 so that the laser pulse P can always be coupled out by reflection onto the deflecting mirror 36 once this laser pulse exceeds a threshold intensity.

The deflecting mirror 36 further deflects the exiting laser beam 42, namely through an amplifier crystal 44 which is constructed in the same way as the oscillator crystal 22 and is optically pumped by rows of diodes 46. Once the laser pulse P has been amplified in the amplifier crystal 44, a frequency doubling takes place in a doubler crystal 48 from the frequency $w_1$ to the frequency $2 \times w_1$ and a further frequency doubling by a doubler crystal 50 from the frequency $2 \times w_1$ to the frequency $4 \times w_1$.

The exiting laser pulse P having the frequency $4w_1$ is focused onto a target T and generates, for example, a plasma thereon in the region of a focus 58, whereby this results in either a coating of a substrate with particles from the plasma or the target or a removal of material from the target.

A frequency doubling of this type is necessary when, as is customarily the case, a neodymium crystal is used as oscillator crystal, for example Nd-YAG or Nd-YLF. A double frequency doubling results in wavelengths in the UV range.

In the simplest case, the inventive laser system is operated with the part of the laser pulse P having the frequency $4 \times w_1$ and the other frequency parts are not used.

Figure 2:
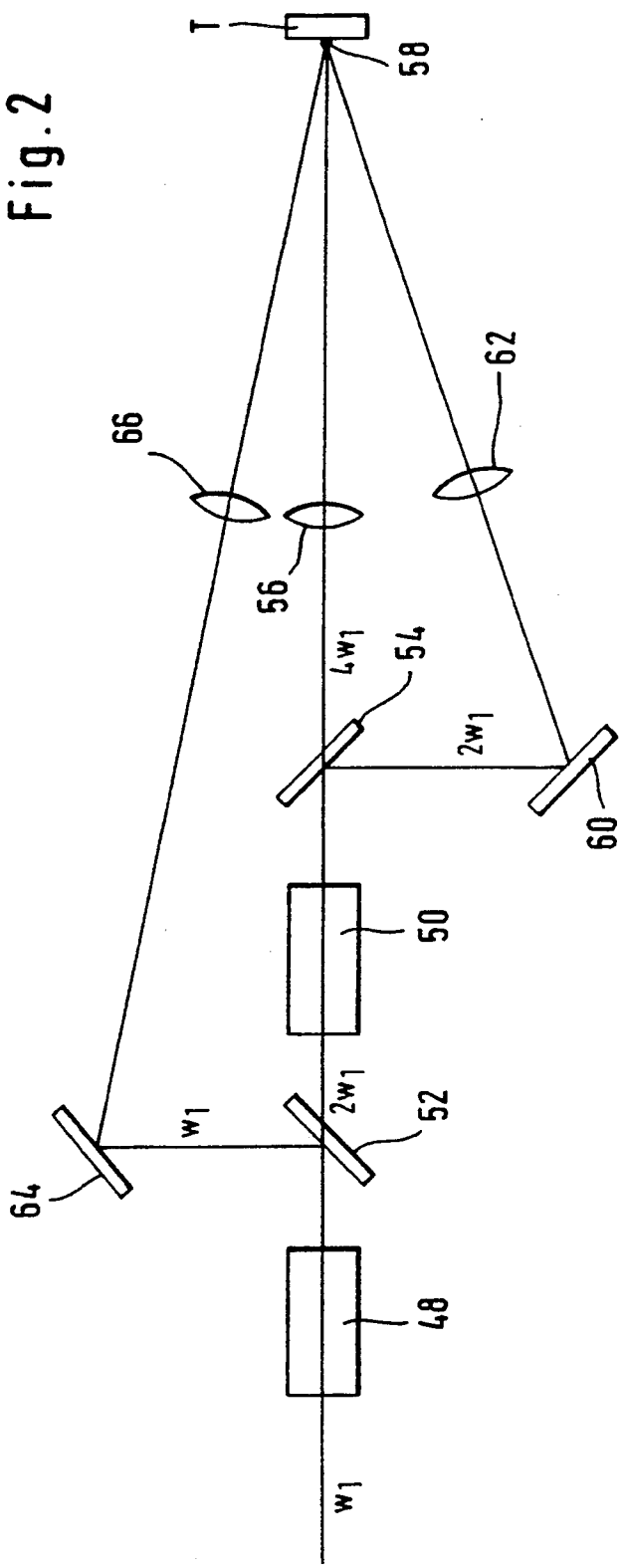
FIG. 2 is an illustration of a detail of a second embodiment of an inventive laser system.

However, a second embodiment of the inventive laser system, illustrated in FIG. 2, is particularly advantageous. In this embodiment, the part $Tw_1$ of the laser pulse having the frequency $w_1$ is masked out following the first doubler crystal 48 by means of a wavelength-selective reflection element 52, whereas the part $T2w_1$ of the laser pulse P having the frequency $2 \times w_1$ enters the second doubler crystal 50 and is partially doubled to the frequency $4 \times w_1$. The portion $T2w_1$ of the part $T4w_1$ is likewise coupled out by a further wavelength-selective reflection element 54 following the second doubler crystal 50 so that the laser pulse P is divided into its individual laser pulse parts having the different frequencies. The laser pulse part $P_0$ with the frequency $4 \times w_1$ is focused directly onto a focus 58 by means of a lens 56, the laser pulse part $P_1$ of the laser pulse P with the frequency $2 \times w_1$ is deflected by a further deflecting element 60 and likewise focused onto the focus 58 by means of a lens 62 but with a time delay caused by extension of the optical path length. As a result, the laser pulse part $P_0$ arrives in the focus first and then, with a time delay, the laser pulse part $P_1$ with the frequency $2 \times w_1$ of the laser pulse.

Figure 3:
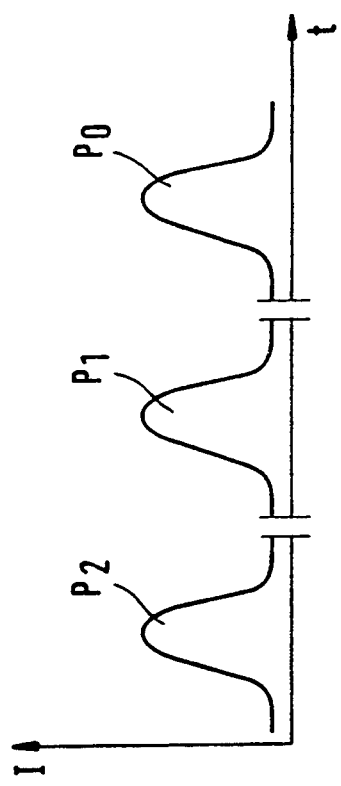
FIG. 3 is schematic illustration of a pulse train having laser pulse parts with different frequencies.

The laser pulse part $P_2$ with the frequency $w_1$ is also deflected by a deflecting element 64 and focused onto the focus 58 by means of a lens 66, whereby an additional extension of the optical path length relative to the laser pulse part $P_1$ is generated so that the laser pulse part $P_2$ again arrives at the focus 58 with a time delay in relation to the pulse $P_1$ (FIG. 3).

As for the rest, the second embodiment is designed in the same way as the first embodiment and so reference is made to the entire subject matter of this first embodiment.

Figure 4:
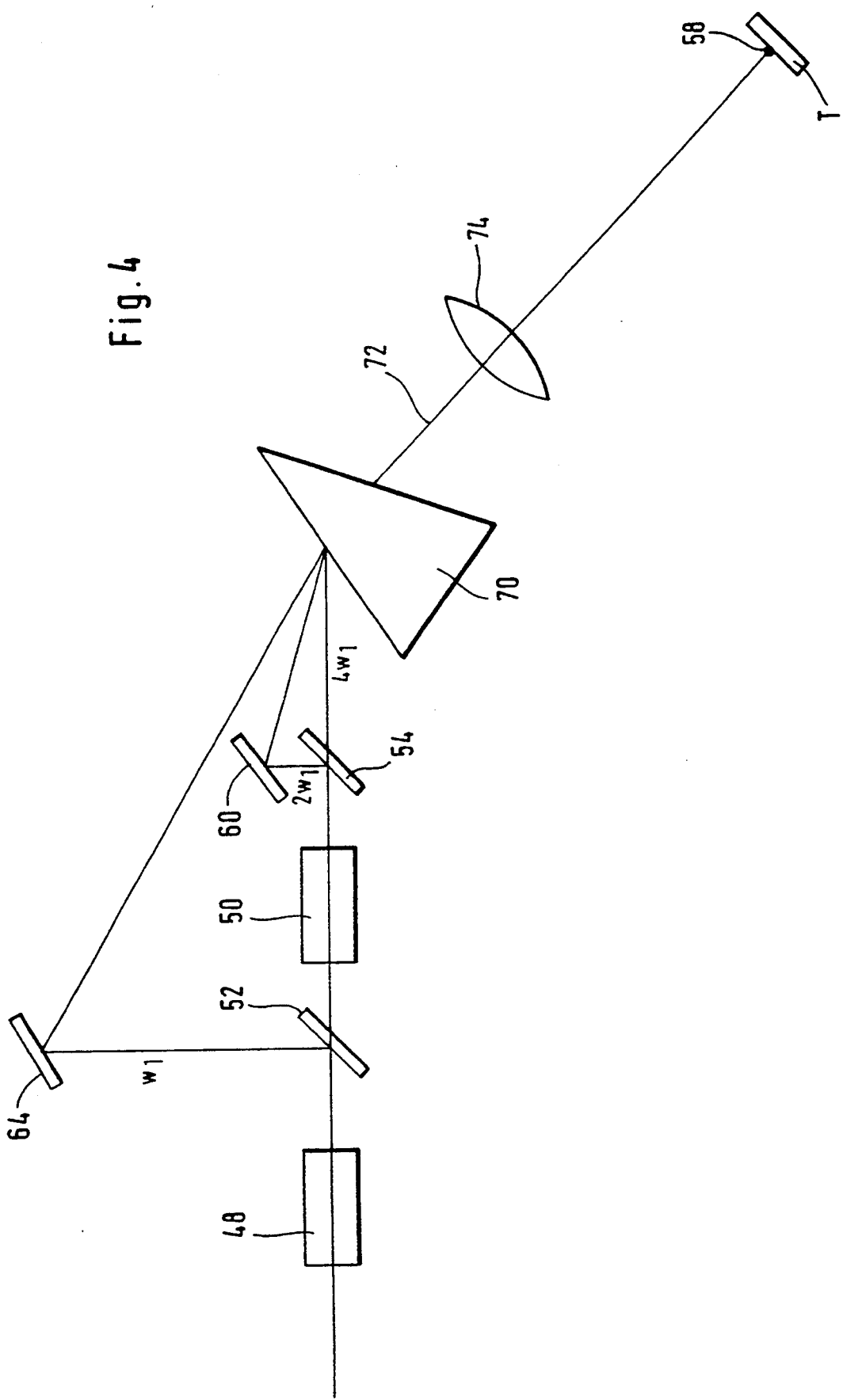
FIG. 4 is a schematic illustration of a detail of a third embodiment of an inventive laser system and FIG. 5 shows an embodiment of a coating station as an example of the use of an inventive apparatus.

In a third embodiment of an inventive laser system, illustrated in FIG. 4, the frequency parts $w_1$ are also coupled out following the first doubler crystal 48 and the frequency parts $2 \times w_1$ following the second doubler crystal 50 by means of the wavelength-selective reflection elements 52 and 54.

At the same time, the laser pulse part $P_1$ is delayed in relation to the laser pulse part $P_0$ and the laser pulse part $P_2$ in relation to the laser pulse part $P_1$, likewise by corresponding extension of the optical path length.

On the other hand, all the laser pulse parts are again combined by means of a prism 70 in one direction 72 and focused onto the focus 58 by means of a common lens 74 so that the pulses $P_0$, $P_1$ and $P_2$ extend colinearly to one another and strike the focus 58.

As for the rest, the third embodiment is designed in the same way as the first embodiment and so reference is made to the entire subject matter of this first embodiment.

As laser system, a laser system can preferably be considered, which has a wavelength impinging on the target T of less than 0.6 μm and pulse durations Tp in the order of 1 to 100 picoseconds.

The power density in the focus 58 is preferably at $10^9$ to $10^{12}$ w/cm$^2$.

The single pulses P have a pulse sequence which is approximately in the 10 kHz range. In accordance with the invention, a maximum of approximately one atom layer of the respective target material is applied per single pulse P, in a coating spot, to the process substrate to be coated with target material.

In the preferred embodiment illustrated in FIG. 3, the laser pulse part $P_0$ having the wavelength of less than 500 nm is followed by additional laser pulse parts $P_1$ and $P_2$ at time intervals of approximately 0.5 to approximately 5 nanoseconds, whereby these laser pulse parts also have a pulse duration Tp which is in the range of 1 to 100 picoseconds.

These laser pulse parts $P_1$ and $P_2$ having a longer wavelength result in a subsequent acceleration of the stream of particles already generated by a plasma in the focus 58 on the target surface, in particular in a homogenization of the particle energy by subsequent heating of the rearward, slower regions of the stream of particles facing the target T. This means that this stream of particles expands on a surface of a substrate at a homogeneous velocity and more effectively in the direction of the coating spot.

A laser system of this type can be used, in particular, for coating stations and structuring stations, preferably for the production of functional structures of semiconductor components.

Figure 5:
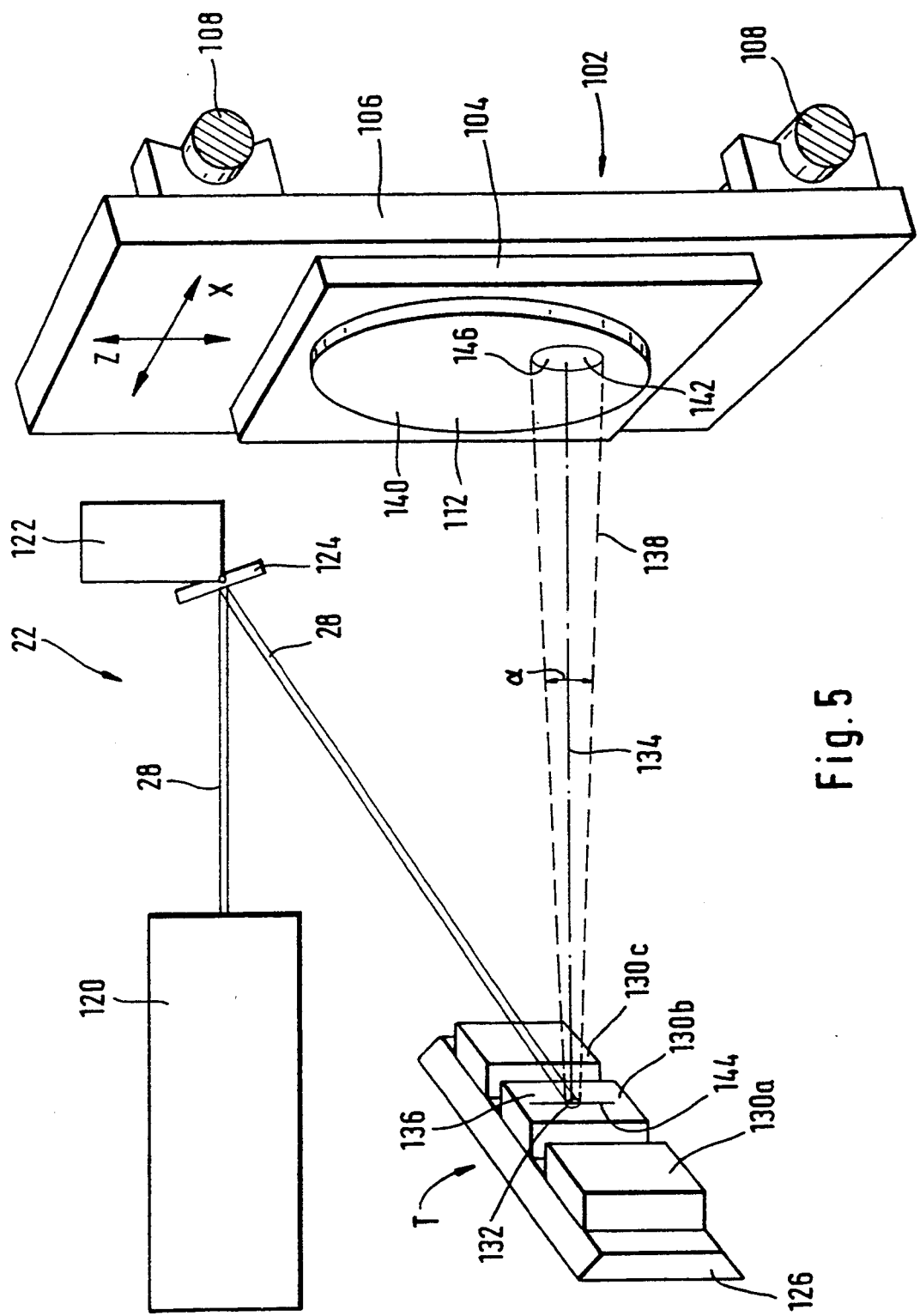

As illustrated in FIG. 5, a laser 120 designed in accordance with one of the aforementioned embodiments is arranged in a coating station of this type. The laser pulses P are reflected onto the target T by a deflecting mirror 124 activatable via a drive 122.

As illustrated in FIG. 5, this target T is, for example, composed of three individual targets 130a, 130b and 130c seated on a target carrier 126, whereby each one of them can be irradiated, for example, at any time by the laser beam 28.

If, as illustrated in FIG. 5, the individual target 130b is irradiated in the region of a radiation spot 132, the target material will expand preferably in the direction of a vertical line 134 to a target surface 136 in the form of a cone 138 symmetrical to this vertical line 134, the cone hereby having, for example, an aperture angle α of approximately 60°. This cone intersects a surface 140 of a process substrate 112 or the respective outermost layer thereof with a coating spot 142, in the region of which the target material is applied to the surface 140 through the cone 138.

In order to achieve a uniform removal of target material, for example, from the individual target 130b with the laser pulses P, the radiation spot 132 is movable on the target surface 136, for example, along a line 144 and preferably transversely thereto, as well. This can be achieved by the deflecting mirror 124 deflecting the laser beam 28 such that the radiation spot 132 migrates relative to the target carrier 126 along the line 44 and, where necessary, transversely to it.

Therefore, the cone 138, and with it the coating spot 142, also migrates to a slight extent on the surface 140 but the distance is not normally sufficient to achieve a full surface coating of the surface 140.

For this reason, a substrate holder 104 of a positioning table 102 displaceable on guides 108 is preferably movable, in addition, in an XZ plane relative to a base unit 106 so that the coating spot 142 migrates over the entire surface 140.

Alternatively, it is also possible to move the target carrier 126 by means of a displacing and positioning unit such that when the substrate 112 is stationary or the surface 140 is stationary the cone 138 and the coating spot 142 migrate over the entire surface 140, with corresponding following guidance of the laser pulses P by means of the deflecting mirror 124. In this respect, the relative movement of the radiation spot 132 on the target surface 136 relative to the individual target 130b is also to be taken into consideration during the following guidance.

The inventive system can, for example, also be used for the process according to German patent 40 22 817.

The present disclosure relates to the subject matter disclosed in German application No. P 42 29 397.9 of Sep. 3, 1992, the entire specification of which is incorporated herein by reference.

What is claimed is:

1. An apparatus for removing material from a target, comprising:
    a high-power laser for generating laser pulses with a pulse duration in the picosecond range and comprising a resonator having a mode-locking device and a Q-switch arranged therein,
    a frequency multiplier following the high-power laser, and
    a beam guide for focusing the laser beam coming from the frequency multiplier onto the target,
    said resonator having fully reflecting end mirrors for generating single high-energy laser pulses, a system for the controlled coupling out of single pulses being arranged in the resonator, and a control being provided for coupling out a single pulse following release of the laser activity by the Q-switch and the build up of the single pulse after repeated round trips through the resonator.

2. Apparatus as defined in claim 1, wherein the control activates the single-pulse coupling-out means within a defined period of time following release of the laser activity by the Q-switch.

3. Apparatus as defined in claim 1, wherein the control activates the single-pulse coupling-out means when the single pulse building up in the resonator reaches an intensity threshold value.

4. Apparatus as defined in claim 1, wherein the single-pulse coupling-out means comprises a polarization-rotating Pockels cell and a polarization-dependent transmission/reflection mirror.

5. Apparatus as defined in claim 1, wherein a laser amplifier is arranged between the high-power laser and the frequency multiplier.

6. Apparatus as defined in claim 1, wherein the frequency multiplier is followed by a coupling-out element for a part of the laser pulse not frequency-multiplied.

7. Apparatus as defined in claim 6, wherein a beam guide is provided for focusing the non-frequency-multiplied part of the laser pulse onto the target.

8. Apparatus as defined in claim 7, wherein the frequency-multiplied part of the laser pulse and the non-frequency-multiplied part of the laser pulse are focused onto the target with separate beam guides.

9. Apparatus as defined in claim 6, wherein the non-frequency-multiplied part of the laser pulse strikes the target with a time delay in relation to the frequency-multiplied part of the laser pulse.

10. Apparatus as defined in claim 9, wherein the beam guide for the non-frequency-multiplied part of the laser pulse comprises a detour line for the pulse delay.

11. Apparatus as defined in claim 6, wherein a colinearizing element is provided for bringing together the frequency-multiplied part of the laser pulse and the non-frequency-multiplied part of the laser pulse.

12. Apparatus as defined in claim 11, wherein the colinearizing element is followed by a common focusing system for the frequency-multiplied part of the laser pulse and the non-frequency-multiplied part of the laser pulse.

13. Apparatus as defined in claim 6, wherein the frequency-multiplied part of the laser pulse and the non-frequency-multiplied part of the laser pulse form a defined pulse sequence.

14. Apparatus as defined in claim 1, wherein the laser pulse comprises a part of the laser pulse repeatedly frequency-multiplied.

15. Process for removing material from a target, wherein:
    laser pulses with a pulse duration in the picosecond range are generated by a high-power laser comprising a resonator having a mode-locking device and a Q-switch arranged therein and multiplied by a frequency multiplier following the high-power laser,
    the laser beam coming from the frequency multiplier is focused onto the target by a beam guide,
    a high-energy single laser pulse is used as the laser pulse, this laser pulse being generated when the laser activity in the resonator is released by the Q-switch,
    following the release of the laser activity a single pulse runs back and forth repeatedly between fully reflecting end mirrors of the resonator and a high-energy single pulse is thereby built up, and
    the high-energy single pulse is coupled out by means of a system for the controlled coupling out of single pulses.

16. Process as defined in claim 15, wherein the single-pulse coupling-out means is activated within a defined period of time following release of the laser activity by the Q-switch.

17. Process as defined in claim 15, wherein the single-pulse coupling-out means is activated when the single pulse building up in the resonator reaches an intensity threshold value.

18. Process as defined in claim 15, wherein a polarization-rotating Pockels cell and a polarization-dependent transmission/reflection mirror are used as single-pulse coupling-out means.

19. Process as defined in claim 15, wherein a laser amplifier is used between the high-power laser and the frequency multiplier.

20. Process as defined in claim 15, wherein a part of the laser pulse not frequency-multiplied is coupled out following the frequency multiplier.

21. Process as defined in claim 20, wherein a non-frequency-multiplied part of the laser pulse is focused onto the target with a beam guide.

22. Process as defined in claim 21, wherein the frequency-multiplied part of the laser pulse and the non-frequency-multiplied part of the laser pulse are focused onto the target with separate beam guides.

23. Process as defined in claim 20, wherein the non-frequency-multiplied part of the laser pulse is applied to the target with a time delay in relation to the frequency-multiplied part of the laser pulse.

24. Process as defined in claim 23, wherein the non-frequency-multiplied part of the laser pulse is applied to the target via a detour line for the pulse delay.

25. Process as defined in claim 20, wherein the frequency-multiplied part of the laser pulse and the non-frequency-multiplied part of the laser pulse are brought together by a colinearizing element.

26. Process as defined in claim 25, wherein the frequency-multiplied part of the laser pulse and the non-frequency-multiplied part of the laser pulse are brought together by a common focusing system following the colinearizing element.

27. Process as defined in claim 20, wherein a defined pulse sequence is formed with the frequency-multiplied part of the laser pulse and the non-frequency-multiplied part of the laser pulse.

28. Process as defined in claim 15, wherein the laser pulse is formed with a part of the laser pulse repeatedly frequency-multiplied.

* * * * *